United States Patent [19]

McCormick et al.

[11] Patent Number: 5,215,860

[45] Date of Patent: Jun. 1, 1993

[54] ENERGY-CURABLE CYANATE COMPOSITIONS

[75] Inventors: Fred B. McCormick, Maplewood; Katherine A. Brown-Wensley, Lake Elmo; Robert J. DeVoe, St. Paul, all of Minn.

[73] Assignee: Minnesota Mining and Manufacturing Company, St. Paul, Minn.

[21] Appl. No.: 234,464

[22] Filed: Aug. 19, 1988

[51] Int. Cl.$^5$ .................. C08G 73/00; C08G 73/06; G03F 7/004; G03F 7/30

[52] U.S. Cl. .......................... 430/270; 204/157.72; 430/325; 430/914; 430/916; 522/36; 522/40; 522/49; 522/54; 522/59; 522/63; 522/64; 522/65; 522/66; 522/163; 522/166; 522/167; 522/171; 522/173; 522/904; 528/43; 528/210; 528/220; 528/225; 528/373; 528/391; 528/399; 528/422; 528/423; 525/504; 544/193

[58] Field of Search .................. 522/66, 173; 528/422, 528/391, 399, 423; 544/193; 430/270

[56] References Cited

U.S. PATENT DOCUMENTS

| | | | |
|---|---|---|---|
| 3,595,900 | 7/1971 | Loudas | 544/193 |
| 3,694,410 | 9/1972 | Oehmke | 260/47 R |
| 3,728,344 | 4/1973 | Emerson | 544/193 |
| 3,842,019 | 10/1974 | Kropp | 260/2 EP |
| 4,094,852 | 6/1978 | Sundermann et al. | 260/37 N |
| 4,183,864 | 1/1980 | Vollhardt et al. | 260/397.3 |
| 4,195,132 | 3/1980 | Sundermann | 528/422 |
| 4,328,343 | 5/1982 | Vollhardt et al. | 546/145 |
| 4,371,689 | 2/1983 | Gaku | 528/422 |
| 4,383,903 | 5/1983 | Ayano | 522/11 |
| 4,429,112 | 1/1984 | Gaku et al. | 528/422 |
| 4,528,366 | 7/1985 | Woo et al. | 528/422 |
| 4,533,727 | 8/1985 | Gaku et al. | 528/361 |
| 4,554,346 | 11/1985 | Gaku et al. | 528/363 |
| 4,604,452 | 8/1986 | Shimp | 528/422 |
| 4,608,434 | 8/1986 | Shimp | 528/422 |
| 4,624,912 | 11/1986 | Zweifel | 522/66 |
| 4,740,577 | 4/1988 | DeVoe et al. | 528/51 |
| 4,861,806 | 8/1989 | Rembold | 522/66 |

FOREIGN PATENT DOCUMENTS

| | | |
|---|---|---|
| 094914 | 3/1983 | European Pat. Off. . |
| 094915 | 3/1983 | European Pat. Off. . |
| 109851 | 7/1984 | European Pat. Off. . |
| 250364 | 1/1987 | European Pat. Off. . |
| 265373 | 2/1988 | European Pat. Off. . |
| 1712 | 3/1987 | PCT Int'l Appl. . |

OTHER PUBLICATIONS

Jensen, "The Lewis Acid-Base Concepts", 1980, pp. viii & 59.
Interez, Inc. "Arocy TM Cyanate Ester Resins and Monomers Safety and Handling Bulletin". 4 pages, Feb. 1988.
U.S. Ser. No. 07/090,694 (Palazzotto et al.).
U.S. Ser. No. 07/090,791 (Brown-Wensley et al.).
E. Martelli, C. Pellizzi, and G. Predieri, *J. Molec. Catalysis*, 22, 89-91 (1983).

*Primary Examiner*—Marion E. McCamish
*Assistant Examiner*—A. H. Koeckert
*Attorney, Agent, or Firm*—Gary L. Griswold; Walter N. Kirn; Lorraine R. Sherman

[57] ABSTRACT

Energy polymerizable compositions comprising at least one cyanate monomer and as curing agent an organometallic compound are disclosed. The compositions are useful in applications requiring high performance, such as high temperature performance; in composites, particularly structural composites; structural adhesives; tooling for structural composites; electronic applications such as printed wiring boards and semiconductor encapsulants; graphic arts; injection molding and prepregs; and high performance binders.

25 Claims, No Drawings

ENERGY-CURABLE CYANATE COMPOSITIONS

FIELD OF THE INVENTION

This invention relates to energy-polymerizable compositions comprising cyanate monomers and as curing agent an organometallic compound and a method therefor. In another aspect, cured articles comprising the composition of the invention are disclosed. The compositions are useful in applications requiring high performance, such as high temperature performance; in composites, particularly structural composites; structural adhesives; tooling for structural composites; electronic applications such as printed wiring boards and semiconductor encapsulants; graphic arts; injection molding and prepregs; and high performance binders.

BACKGROUND OF THE INVENTION

Industry is constantly searching for lighter, stronger, and more resistant materials to replace those in present use Cyanate ester resins are known for their thermal stability, chemical inertness, solvent resistance, and dielectric properties. Thus, more and more uses are being found in a variety of fields which demand high performance materials, such as structural composites, printed wiring boards, semiconductor encapsulants, structural adhesives, graphic arts, injection molding and prepregs, and high performance binders.

Cyanate ester resins are formed from polyfunctional cyanate monomers (see U.S. Pat. No. 4,094,852). Generally, because it is desirable to achieve lower curing temperatures and faster curing times, a catalyst is employed. Catalysts which are effective include acids, bases, salts, nitrogen and phosphorus compounds, for example, Lewis acids such as $AlCl_3$, $BF_3$, $FeCl_3$, $TiCl_4$, $ZnCl_2$, $SnCl_4$; Bronsted acids such as HCl, $H_3PO_4$; aromatic hydroxy compounds such as phenol, p-nitrophenol, pyrocatechol, dihydroxynaphthalene; various other compounds such as sodium hydroxide, sodium methoxide, sodium phenoxide, trimethylamine, triethylamine, tributylamine, diazabicyclo[2.2.2]octane, quinoline, isoquinoline, tetrahydroquinoline, tetraethylammonium chloride, pyridine-N-oxide, tributylphosphine, zinc octoate, tin octoate, zinc naphthenate, and mixtures thereof.

Oehmke (U.S. Pat. No. 3,694,410) teaches that chelates of metal ions of the nonionic type or ionic type, with 1 to 6 or more chelate rings, can catalyze the formation of polytriazines from aromatic polyfunctional cyanates. Similarly, Woo and Deller (U.S. Pat. No. 4,528,366) have shown that cobalt salts of $C_{6-20}$ carboxylic acids are useful catalysts for polytriazine formation, preferably cobalt octoate and cobalt naphthenate. Shimp (U.S. Pat. Nos. 4,604,452 and 4,608,434) has shown that alcoholic solutions of metal carboxylates are effective catalyst compositions for polytriazine formation. Organometallic cobalt compounds have been used to catalyze the trimerization of acetylenes (U.S. Pat. No. 4,183,864) and the co-trimerization of acetylenes and nitriles (U.S. Pat. No. 4,328,343). The photocatalyzed cyclotrimerization of aryl isocyanates using metal carbonyl complexes has also been taught (E. Martelli, C. Pellizzi, and G. Predieri, J. Molec. Catalysis 22, 89–91 (1983)).

Energy polymerizable compositions comprising ionic salts of organometallic complex cations and cationically sensitive materials and the curing thereof has been taught [see European Patent Nos. 109,851, 1984; 094,914, 1983 and Derwent Abstract; and 094,915, 1983 and Derwent Abstract (English language equivalent So. Afr. 837966)]. EP 094,915 and EP 109,851 disclose curing in one and two stages. Energy polymerizable compositions comprising ionic salts of organometallic complex cations and polyurethane precursors or isocyanates has also been taught (U.S. Pat. No. 4,740,577 which also discloses curing in one and two stages; European Patent Nos. 265,373, 1988, Derwent Abstract; and 250,364, 1987, Derwent Abstract).

In certain applications, advantages in terms of improved potlife, physical properties of the cured material, and flexibility with respect to process parameters, particularly temperature, can be achieved with the use of photocatalysts. Gaku, Kimbura, and Yokoi (U.S. Pat. No 4,554,346) disclosed (photo)curable resins from cyanate ester compounds. The inventors acknowledged that "the degree of radical-polymerizability or photopolymerizability of the cyanate ester itself is small," resulting in poorly cured materials. Instead, Gaku, et al., used mixtures of polyfunctional cyanate esters with at least one compound having hydroxy group(s) and radical-polymerizable unsaturated double bonds, the compounds used in quantities such that the ratio of cyanato groups to the hydroxy groups is in the range from 1:0.1 to about 1:2, and a radical polymerization (photo)initiator, at elevated temperature. These materials would not be expected to yield the same polytriazine materials obtainable from direct polymerization of the polyfunctional cyanates to polytriazines. To our knowledge, no other photoinitiators or photocatalysts for polyfunctional cyanate curing to polytriazines have been disclosed.

What the prior art has not taught, but what the present invention teaches is the use of organometallic compounds for the curing of cyanate monomers.

SUMMARY OF THE INVENTION

The present invention provides energy polymerizable compositions comprising at least one cyanate monomer and as curing agent an organometallic compound. The compositions are useful in applications requiring high performance, such as high temperature performance; for composites, particularly structural composites for aircraft; in structural adhesives; in tooling for structural composites; in electronic applications, such as printed wiring boards and semiconductor encapsulants; graphic arts; in injection molding and prepregs; and in high performance binders.

Advantages of compositions of the present invention include:

Readily available cyanate monomers can be used without the need for preparing monomers containing other polymerizable groups, and with the advantage that the cyanate monomers generally provide superior properties when cured. The compositions are free of hydroxy functionality.

Organometallic compounds as catalysts:

provide curing, including radiation curing, at significantly lower temperatures or faster rates than previously described catalysts, allow more efficent processing and greater latitude in coating substrates, provide a fine degree of control of curing temperature by control of catalyst composition, and are significantly more soluble than many previously described catalysts, making 100% reactive compositions possible.

The composition of the present invention can be cured by at least one of thermal energy, by electromagnetic radiation, and by accelerated particles. Radiation processing greatly expands the utility and potential applications of cyanate resins; it allows greater flexibility in processing, including curing at faster rates or lower temperatures or two-stage curing (photolysis followed by heating). Radiation processing, particularly utilizing electron beam and photogenerated catalysts, has capability for penetrating and polymerizing thick and pigmented coatings.

In this application:

"energy polymerizable" means curable by means of electromagnetic radiation (ultraviolet and visible) accelerated particles (including electron beam), and thermal (infrared and heat) means;

"catalytically-effective amount" means a quantity sufficient to effect polymerization of the curable composition to a polymerized product at least to a degree to cause an increase in the viscosity of the composition;

"organometallic compound" means a salt or covalently bonded compound in which at least one carbon atom of an organic group is bonded to a metal atom (see "Basic Inorganic Chemistry", F.A. Cotton, G. Wilkinson, Wiley, New York, 1976, p. 497);

"cyanate monomer" means a chemical substance in which at least one —OCN group is bonded to an organic radical R through the oxygen atom, forming an R—OCN bond; and "curing agent" and "catalyst" are terms which are used interchangeably.

DETAILED DESCRIPTION OF THE INVENTION

The present invention provides, in a preferred embodiment, a thermally polymerizable composition comprising at least one cyanate monomer and an organometallic compound as a catalyst or curing agent therefor.

In a second embodiment, this invention provides a photopolymerizable composition comprising at least one cyanate monomer and an organometallic compound as a catalyst or curing agent therefor.

The curing agent useful in the energy polymerizable compositions of the invention comprises an organometallic compound having the structure $$[L^1L^2L^3M]^{+e}X_f \qquad \qquad I$$

wherein
$L^1$ represents none, or 1 to 12 ligands contributing pi-electrons that can be the same or different selected from substituted and unsubstituted acyclic and cyclic unsaturated compounds and groups and substituted and unsubstituted carbocyclic aromatic and heterocyclic aromatic compounds, each capable of contributing 2 to 24 pi-electrons to the valence shell of M;

$L^2$ represents none, or 1 to 24 ligands that can be the same or different contributing an even number of sigma-electrons selected from mono-, di-, and tridentate ligands, each donating 2, 4, or 6 sigma-electrons to the valence shell of M;

$L^3$ represents none, or 1 to 12 ligands that can be the same or different, each contributing no more than one sigma-electron each to the valence shell of each M;

M represents 1 to 4 of the same or different metal atoms selected from the elements of Periodic Groups IVB (Ti, Zr, Hf), VB (V, Nb, Ta), VIB (Cr, Mo, W), VIIB (Mn, Tc, Re), and VIII (Fe, Ru, Os, Co, Rh, Ir, Ni, Pd, Pt) (commonly referred to as transition metals);

e is an integer having a value of 0, 1 or 2, such that the organometallic portion of the molecule is neutral, cationic or dicationic;

X is an anion selected from organic sulfonate and halogenated metal or metalloid groups;

f is an integer of 0, 1, or 2, the number of anions required to balance the charge e on the organometallic portion;

with the proviso that the organometallic compound contains at least one metal-carbon bond; and with the proviso that $L^1$, $L^2$, $L^3$, M, e, X, and f are chosen so as to achieve a stable electronic configuration.

There are restrictions on the sum of electrons donated by the ligands, $L^1$, $L^2$, $L^3$ of formula I and the valence electrons possessed by the metal. For most organometallic compounds not involving intramolecular metal-metal bonding, this sum is governed by the "eighteen electron rule" [see J. Chem. Ed., 46, 811 (1969)]. This rule is sometimes called the "nine orbital rule", "the effective number rule", or the "rare gas rule". This rule states that the most stable electronic configurations for organometallic compounds tend to be those in which the sum of the electrons donated by the ligands and the metal is eighteen. Those skilled in the art, however, know that there are exceptions to this rule and that organometallic compounds having a sum of 16, 17, 19, and 20 electrons are also known. Therefore, organometallic compounds not including intramolecular metal-metal bonding as described by formula I, in which complexed metals having a total sum of 16, 17, 18, 19, or 20 electrons in the valence shell, are included within the scope of the invention.

For compounds described in formula I in which intramolecular metal-metal bonding exists, serious departure from the "eighteen electron rule" can occur. It has been proposed [J. Amer. Chem. Soc. 100, 5305 (1978)] that the departure from the "eighteen electron rule" in these transition metal compounds is due to the metal-metal interactions destabilizing the metal p orbitals to an extent to cause them to be unavailable for ligand bonding. Hence, rather than count electrons around each metal separately in a metal cluster, cluster valence electrons (CVE) are counted. A dinuclear compound is seen to have 34 CVEs, a trinuclear compound 48 CVEs, and a tetranuclear compound having tetrahedron, butterfly, and square planar geometry is seen to have 60, 62, or 64 CVEs, respectively. Those skilled in the art, however, know that there are exceptions to this electron counting method and that organometallic cluster compounds having a sum of 42, 44, 46, 50 CVEs for a trinuclear compound and 58 CVEs for a tetranuclear compound are also known. Therefore, di, tri, or tetranuclear organometallic compounds are described by formula I in which the complexed metal cluster, MM, MMM, or MMMM has a sum of 34; 42, 44, 46, 48, 50; 58, 60, 62, or 64 CVEs in the valence shell, respectively, and are included within the scope of this invention.

Ligands $L^1$ to $L^3$ are well known in the art of transition metal organometallic compounds. At least one such ligand must be present in the catalyst of the present invention.

Ligand $L^1$ of general formula I is provided by any monomeric or polymeric compound having an accessible unsaturated group, i.e., an ethylenic, —C═C— group; acetylenic, —C≡C— group; or aromatic group which has accessible pi-electrons regardless of the total molecular weight of the compound. By "accessible", it is meant that the compound (or precursor compound from which the accessible compound is prepared) bearing the unsaturated group is soluble or swellable in a reaction medium, such as an alcohol, e.g., methanol; a ketone, e.g., methyl ethyl ketone; an ester, e.g., amyl acetate; a halocarbon, e.g., trichloroethylene; an alkane, e.g., decalin; an aromatic hydrocarbon, e.g., anisole; an ether, e.g., tetrahydrofuran; etc, or that the compound is divisible into very fine particles of high surface area so that the unsaturated group (including aromatic group) is sufficiently close to a metal atom to form a pi-bond between that unsaturated group and the metal atom.

By polymeric compound, is meant, as explained below, that the ligand can be a group on a polymeric chain. Illustrative of ligand $L^1$ are the linear and cyclic ethylenic and acetylenic compounds having less than 100 carbon atoms (when monomeric), preferably having less than 60 carbon atoms, and from zero to 10 hetero atoms selected from nitrogen, sulfur, non-peroxidic oxygen, phosphorous, arsenic, selenium, boron, antimony, tellurium, silicon, germanium, and tin, the ligands being those such as, for example, ethylene, acetylene, propylene, methylacetylene, alpha-butene, 2-butene, diacetylene, butadiene, 1,2-dimethylacetylene, cyclobutene, pentene, cyclopentene, hexene, cyclohexene, 1,3-cyclohexadiene, cyclopentadiene, 1,4-cyclohexadiene, cycloheptene, 1-octene, 4-octene, 3,4-dimethyl-3-hexene, and 1-decene; $eta^3$-allyl, $eta^3$-pentenyl, norbornadiene, $eta^5$-cyclohexadienyl, cycloheptatriene, cyclooctatetraene, and substituted and unsubstituted carbocyclic and heterocyclic aromatic ligands having up to 25 rings and up to 100 carbon atoms and up to 10 hetero atoms selected from nitrogen, sulfur, non-peroxidic oxygen, phosphorus, arsenic, selenium, boron, antimony, tellurium, silicon, germanium, and tin, such as, for example, $eta^5$-cyclopentadienyl, benzene, mesitylene, hexamethylbenzene, fluorene, naphthalene, anthracene, chrysene, pyrene, $eta^7$-cycloheptatrienyl, triphenylmethane, paracyclophane, 1,4-diphenylbutane, $eta^5$-pyrrole, $eta^5$-thiophene, $eta^5$-furan, pyridine, gamma-picoline, quinaldine, benzopyran, thiochrome, benzoxazine, indole, acridine, carbazole, triphenylene, silabenzene, arsabenzene, stibabenzene, 2,4,6-triphenylphosphabenzene, $eta^5$-selenophene, dibenzostannepine, $eta^5$-tellurophene, phenothiarsine, selenanthrene, phenoxaphosphine, phenarsazine, phenatellurazine, $eta^5$-methylcyclopentadienyl, $eta^5$-pentamethylcyclopentadienyl, and 1-phenylborabenzene. Other suitable aromatic compounds can be found by consulting any of many chemical handbooks.

As mentioned before, the ligand can be a unit of a polymer, for example, the phenyl group in polystyrene, poly(styrene-co-butadiene), poly(styrene-co-methyl methacrylate), poly(alpha-methylstyrene), polyvinylcarbazole, and polymethylphenylsiloxane; the cyclopentadiene group in poly(vinylcyclopentadiene); the pyridine group in poly(vinylpyridine), etc. Polymers having a weight average molecular weight up to 1,000,000 or more can be used. It is preferable that 1 to 50 percent of the unsaturated or aromatic groups present in the polymer be complexed with organometallic groups.

Each ligand $L^1$ can be substituted by groups that do not interfere with the complexing of the ligand with the metal atom or which do not reduce the solubility of the ligand to the extent that complexing with the metal atom does not take place. Examples of substituting groups, all of which preferably have less than 30 carbon atoms and up to 10 hetero atoms selected from nitrogen, sulfur, non-peroxidic oxygen, phosphorus, arsenic, selenium, antimony, tellurium, silicon, germanium, tin, and boron, include hydrocarbyl groups such as methyl, ethyl, butyl, dodecyl, tetracosanyl, phenyl, benzyl, allyl, benzylidene, ethenyl, and ethynyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl and phenoxycarbonyl; hydrocarbylcarbonyl such as formyl, acetyl, and benzoyl; hydrocarbylcarbonyloxy such as acetoxy, benzoxy, and cyclohexanecarbonyloxy; hydrocarbylcarbonamido, e.g., acetamido, benzamido; azo, boryl; halo, e.g., chloro, iodo, bromo, and fluoro; hydroxy; cyano; nitro; nitroso, oxo; dimethylamino; diphenylphosphino, diphenylarsino; diphenylstibine; trimethylgermyl; tributylstannyl; methylseleno; ethyltelluro; and trimethylsiloxy; condensed rings such as benzo, cyclopenta; naphtho, indeno; and the like.

Each ligand $L^2$ in formula I is provided by monodentate and polydentate compounds preferably containing up to about 30 carbon atoms and up to 10 hetero atoms selected from nitrogen, sulfur, non-peroxidic oxygen, phosphorus, arsenic, selenium, antimony, and tellurium, where upon addition to the metal atom, following loss of zero, one, or two hydrogens, the polydentate compounds preferably forming with the metal, M, a 4-, 5-, or 6-membered saturated or unsaturated ring. Examples of suitable monodentate compounds or groups are carbon monoxide, carbon sulfide, carbon selenide, carbon telluride, alcohols such as ethanol, butanol, and phenol; nitrosonium (i.e., $NO^+$); compounds of Group VA elements such as ammonia, phosphine, trimethylamine, trimethylphosphine, triphenylamine, triphenylphosphine, triphenylarsine, triphenylstibine, tributylphosphite; nitriles such as acetonitrile, benzonitrile; isonitriles such as phenylisonitrile, butylisonitrile; carbene groups such as ethoxymethylcarbene, dithiomethoxycarbene; alkylidenes such as methylidene, ethylidene; suitable polydentate compounds or groups include 1,2-bis(diphenylphosphino)ethane, 1,2- bis(diphenylarsino)ethane, bis(diphenylphosphino)methane, ethylenediamine, proplenediamine, diethylenetriamine, 1,3-diisocyanopropane, and hydridotripyrazolylborate; the hydroxycarboxylic acids such as glycolic acid, lactic acid, salicylic acid; polyhydric phenols such as catechol and 2,2'-dihydroxybiphenyl; hydroxyamines such as ethanolamine, propanolamine, and 2-aminophenol; dithiocarbamates such as diethyldithiocarbamate, dibenzyldithiocarbamate; xanthates such as ethyl xanthate, phenyl xanthate; the dithiolenes such as bis(perfluoromethyl)-1,2-dithiolene; aminocarboxylic acids such as alanine, glycine and o-aminobenzoic acid; dicarboxylic diamines as oxalamide, biuret; diketones such as 2,4-pentanedione; hydroxyketones such as 2-hydroxyacetophenone; alpha-hydroxyoximes such as salicylaldoxime; ketoximes such as benzil oxime; and glyoximes such as dimethylglyoxime.

Other suitable groups are the inorganic groups such as, for example, $CN^-$, $SCN^-$, $F^-$, $OH^-$, $Cl^-$, $Br^-$, $I^-$, and $H^-$ and the organic groups such as, for example, acetoxy, formyloxy, benzoyloxy, etc. As mentioned before, the ligand can be a unit of a polymer, for example the amino group in poly(ethyleneamine); the phosphino group in poly(4-vinylphenyldiphenylphosphine); the carboxylic acid group in poly(acrylic acid); and the isonitrile group in poly(4-vinylphenylisonitrile).

Suitable ligands $L^3$ in formula I include any group having in its structure an atom with an unshared electron. Suitable groups can contain any number of carbon atoms and hetero atoms but preferably contain less than 30 carbon atoms and up to 10 hetero atoms selected from nitrogen, sulfur, oxygen, phosphorus, arsenic, selenium, antimony, tellurium, silicon, germanium, tin, and boron. Examples of such groups are hydrocarbyl groups such as methyl, ethyl, propyl, hexyl, dodecyl, phenyl, tolyl, etc.; unsaturated hydrocarbyl groups such as vinyl, $eta^1$-allyl, $eta^1$-butenyl, $eta^1$-cyclohexenyl; the hydrocarbyl derivatives of a Group IVA element such as trimethylgermanyl, triphenylstannyl, and trimethylsilyl, triphenyllead, etc.; and organic groups such as formyl, acetyl, propionyl, acryloyl, octadecoyl, benzoyl, toluenesulfonyl, oxalyl, malonyl, o-phthaloyl.

Also suitable as $L^3$ is any group having in its structure two, three, or four unshared electrons. Examples of such groups are $CH_2$, $CHCH_3$, $SiMe_2$, $SiPh_2$ (wherein Ph is phenyl), $SnPh_2$, $GePh_2$, CH, SiMe, SiPh, SnPh, C, Si, and Sn.

M can be any element from the Periodic Groups IVB, VB, VIB, VIIB, and VIIIB, such as, for example, Ti, Zr, Hf, V, Nb, Ta, Cr, Mo, W, Mn, Tc, Re, Fe, Ru, Os, Co, Rh, Ir, Ni, Pd and Pt.

Each X is provided by organic sulfonates, or halogenated metals or metalloids. Examples of such ions are $CH_3SO_3^-$, $CF_3SO_3^-$, $C_6H_5SO_3^-$, p-toluenesulfonate, p-chlorobenzenesulfonate and related isomers and the like, and those in which X has the formula $DZ_r$, wherein D is a metal from Groups IB to VIIIB or a metal or metalloid from Groups IIIA to VA of the Periodic Chart of Elements, Z is a halogen atom or hydroxyl group, and r is an integer having a value of 1 to 6. Preferably, the metals are copper, zinc, titanium, vanadium, chromium, manganese, iron, cobalt, or nickel and the metalloids preferably are boron, aluminum, antimony, tin, arsenic, and phosphorus. Preferably, the halogen, Z, is chlorine or fluorine. Illustrative of suitable anions are $BF_4^-$, $PF_6^-$, $AsF_6^-$, $SbF_6^-$, $FeCl_4^-$, $SnCl_5^-$, $SbF_5^-$, $AlF_6^-$, $GaCl_4^-$, $InF_4^-$, $TiF_6^-$, etc. Preferably, the anions are $CF_3SO_3^-$, $BF_4^-$, $PF_6^-$, $SbF_6^-$, $SbF_5OH^-$, $AsF_6^-$, and $SbCl_6^-$.

Covalently bonded organometallic compounds useful in the present invention are available from Strem Chemical Company (Newburyport, Mass.) or can be prepared by literature methods known to those skilled in the art, see for example Inorg. Chem. 17, 1003 (1978), Chem. Ber. 102, 2449 (1969), J. Organomet. Chem. 135, 373 (1977), and Inorg. Chem. 18, 553 (1979). Organometallic complex salts useful in the present invention are available from Strem Chemical Company or can be prepared as disclosed in EP 109851, EP 094914, and EP 094915.

Illustrative examples of organometallic compounds according to formula I include metal carbonyls such as $Cr(CO)_6$, $Mo(CO)_6$, $W(CO)_5$, $Fe(CO)_9$, $Fe_2(CO)_9$; metal-metal bonded binuclear compounds such as $[CpFe(CO)_2]_2$, $Mn_2(CO)_{10}$, $[CpMo(CO)_3]_2$, $[CpW(CO)_2]_2$, $Re_2(CO)_{10}$, $Co_2(CO)_8$, $Cp(CO)_3W-Mo(CO)_3Cp$, $Cp(CO)_3Mo-Mn(CO)_5$, $Cp(CO)_3Mo-Re(CO)_5$, $(CO)_5Mn-Fe(CO)_2Cp$, $Cp(CO)_3W-Mn(CO)_5$, $Cp(CO)_3W-Re(CO)_5$, $Cp(CO)_3Mo-Co(CO)_4$, $Cp(CO)_3W-Co(CO)_4$, $Cp(CO)_3Mo-Fe(CO)_2Cp$, $Cp(CO)_3W-Fe(CO)_2Cp$, $[CpMo(CO)_2PPh_3]_2$, $Mn_2(CO)_9PPh_3$, $Mn_2(CO)_8(PPh_3)_2$, $(CO)_5Mn-Re(CO)_5$, $Mn_2(CO)_8(1,10$-phenanthroline$)$, $Re_2(CO)_8(1,10$-phenanthroline$)$, $Re_2(CO)_8(2,2'$-biquinoline$)$, $[CpNi(CO)_2]_2$, $[Cp^*Fe(CO)_2]_2$, $Cp(CO)_2Fe-Fe(CO)(PPh_3)Cp$, $Cp(CO)_3Mo-Mo(CO)_2(PPh_3)Cp$; metal clusters such as $Co_4(CO)_{12}$, $Fe_3(CO)_{12}$, $Ru_3(CO)_{12}$, $Os_3(CO)_{12}$, $Ru_3(CO)_{11}PPh_3$, $Ru_3(CO)_{10}(Ph_2P-CH_2CH_2-PPh_2)$, $Fe_2Ru(CO)_{12}$, $Ir_4(CO)_{12}$; compounds containing a metal-Group IVA bond such as $CpFe(CO)_2SnPh_3$, $CpFe(CO)_2GePh_3$, $[CpFe(CO)_2]_2SnPh_2$, $CpMo(CO)_3SnPh_3$, $(CO)_5MnSnPh_3$, $[(CO)_5Mn]_2SnPh_2$, $CpFe(CO)_2PbPh_3$, $CpFe(CO)_2CH_2Ph$, $CpFe(CO)_2(COPh)$, $CpFe(CO)_2(SiPh_3)$, $(CO)_5MnpbPh_3$, $(CO)_5ReSnPh_3$, $CpPtMe_3$, $(MeCp)PtMe_3$, $(Me_3SiCp)PtMe_3$, $CpW(CO)_3Me$, $[CpFe(CO)_2]_4Si$; salts of organometallic complex cations such as $Cp(CO)_3Fe(1+)PF_6(1-)$, $Cp(CO)_2(CS)Fe(1+)BF_4(1-)$, $Cp(CO)(Ph_3Sb)_2Fe(1+)PF_6(1-)$, $Cp(CO)_3Ru(1+)FeCl_4(1-)$, $Cp(CO)_2(Ph_3Sb)Fe(1+)SbF_6(1-)$, $(MeCp)(CO)_2(NO)Mn(1+)SbF_6(1-)$, $(MeCp)(eta^3$-allyl$)(CO)_2Mn(1+)BF_4(1-)$, $Cp(CO)_4Mo(1+)PF_6(1-)$, $eta^5$-pentadienyl$(CO)_3Fe(1+)BF_4(1-)$, $(eta^5$-cyclohexadienyl$)(CO)_3Fe(1+)AsF_6(1-)$, $(eta^5$-cyclohexadienyl$)$(ethylidene)$(CO)(Ph_3P)Fe(1+)BF_4(1-)$, $Cp$(ethoxymethylcarbene)$(CO)(Ph_3P)Fe(1+)BF_4(1-)$, $Cp$(dithiomethoxycarbene)$(CO)_2Fe(1+)PF_6(1-)$, $Cp(CO)_2$(methylisonitrile)$Fe(1+)AsF_6(1-)$, $(eta^6$-toluene)$CO)_3Mn(1+)SbF_6(1-)$, $(eta^6$-mesitylene$)(CO)_3Re(1+)SbF_6(1-)$, $(eta^7$-cycloheptatrienyl$)(CO)_3Cr(1+)PF_6(1-)$, $(eta^7$-cycloheptatrienyl$)(CO)_3W(1+)AsF_6(1-)$, $Cp(eta^2$-1-pentene$)(CO)_2Fe(1+)BF_4(1-)$, $(eta^6$-benzene$)CpFe(1+)PF_6(1-)$, $(eta^6$-mesitylene$)CpFe(1+)BF_4(1-)$, $(eta^6$-naphthalene$)CpFe(1+)SbF_6(1-)$, $(eta^6$-acetophenone$)(MeCp)Fe(1+)AsF_6(1-)$, $Cp_2Co(1+)PF_6(1-)$, $Cp_2Fe(1+)SbF_6(1-)$, bis$(eta^5$-chlorocyclopentadienyl$)Ni(1+)PF_6(1-)$, bis$(eta^6$-benzene$)Cr(1+)SbF_6(1-)$, $(CO)_4(Ph_3P)Co(1+)PF_6(1-)$, $(CO)_3(Ph_3P)_2Ir(1+)PF_3(1-)$, $(eta^3$-allyl$)(CO)_5Cr(1+)BF_4(1-)$, $(CO)_5(NO)Mo(1+)PF_6(1-)$, $(eta^3$-allyl$)(CO)_4Fe(1+)SbF_6(1-)$, $(CO)_6Re(1+)SbF_6(1-)$, bis$(eta^6$-hexamethylbenzene$)Mn(1+)BF_4(1-)$, bis$(eta^6$-mesitylene$)$vanadium$(1+)PF_6(1-)$, $(eta^7$-cycloheptatrienyl$)CpMn(1+)AsF_6(1-)$, $(eta^8$-cyclooctatetraenyl$)CpCr(1+)PF_6(1-)$, $(eta^6$-fluorene$)CpFe(1+)PF_6(1-)$, $(eta^6$-1-phenylborabenzene$)CpCo(1+)PF_6(1-)$, $Cp(eta^5$-N-methylpyrrolyl$)Fe(1+)PF_6(1-)$, $(eta^6$-2,3,4,5-tetrathiomethoxybenzene$)CpFe(1+)AsF_6(1-)$, $[(eta^6$-1,2,3,3a,13b,13a)benzo$(10,11)$chryseno$(2,3$-d$)(1,3$-$)$dioxide$](MeCp)Fe(1+)PF_6(1-)$, bis$(eta^5$-acetylcyclopentadienyl$)Fe(1+)BF_4(1-)$, $(eta^3$-1-methylallyl$)(CO)_4Fe(+1)PF_6(1-)$, $(eta^3$-1,3-dimethylallyl$)(CO)_4Fe(+1)SbCl_6(1-)$; salts of organometallic complex dications such as bis$(eta^6$-hexamethylbenzene$)Co(2+)[AsF_6(1-)]_2$, bis$(eta^6$-mesitylene$)Fe(2+)[SbF_6(1-)]_2$, bis$(eta^6$-hexamethylbenzene$)Ni(2+)[SbF_6(1-)]_2$, bis$(eta^6$-hexamethylbenzene$)Fe(2+)[PF_6(1-)]_2$, $[(eta^6$-1,2,3,4,5,6)$(eta^6$-7,8,9,10,11,12)biphenyl$]Cp_2Fe_2(2+)[BF_4(1-)]_2$, $[(eta^6$-1,2,3,4,4a,9a)$(eta^6$-5,6,7,8,8a,-

5a)fluorene]Cp$_2$Fe(2+)[PF$_6$(1−)]$_2$, [(eta$^6$-1,2,3,4,4a,1-2a)(eta$^6$-7,8,9,10,10a,6a)chrysene]bis(eta$^6$-benzene)Cr$_2$(2+)[SbF$_6$(1−)]$_2$, (CO)$_2$bis[(diphenylphosphino)ethane]Cp$_2$Fe$_2$(2+)[PF$_6$(1−)]$_2$, [(eta$^6$-4,5,5a,28c,28b,3a)(eta$^6$-8a,8b,20d,22a,22b,24c)1H, 14H-dipyrano(3,4,5-gh:3',4',5'-g'h')anthra(2",1"',9"':4,5,6; 6",5",10":4',5'6')diisoquino(2,1-a:2',1'-al)dipyrimidine]Cp$_2$Fe$_2$(2+)[SbF$_6$(1−)]$_2$, [(eta$^6$-1,2,3,3a,16c,16b)(eta$^6$-9,10,11,11a,13c,8b)cycloocta(1,2,3,4-def:5,6,7,8-d'e'f')diphenanthrene]bis(eta$^5$-acetylcyclopentadienyl)Fe(2+)[BF$_4$(1−)]$_2$; and other organometallic compounds such as (MeCp)Mn(CO)$_3$, CpMn(CO)$_3$, CpFe(CO)$_2$Cl, [(p-cymene)RuCl$_2$]$_2$, (eta$^6$-benzene)Cr(CO)$_3$, Re(CO)$_5$Br, Cp$_2$Fe, Cp$_2$TiCl$_2$; wherein Me is methyl
Ph is phenyl
Cp is eta$^5$-cyclopentadienyl
Cp* is eta$^5$-pentamethylcyclopentadienyl
MeCp is eta$^5$-methylcyclopentadienyl
Me$_3$SiCp is eta$^5$-trimethylsilylcyclopentadienyl The cyanate monomers that can be polymerized using the curing agent of the present invention contain at least one —OCN group, and are of the general formula $$Q(OCN)_p \qquad \qquad II$$

wherein p can be an integer from 1 to 7, and wherein Q comprises at least one of 1) a mono-, di-, tri-, or tetravalent aromatic hydrocarbon containing 5 to 30 carbon atoms, 2) 1 to 5 aliphatic or polycyclic aliphatic mono- or divalent hydrocarbons containing 7 to 20 carbon atoms, 1) and 2) optionally comprising 1 to 10 heteroatoms selected from the group consisting of non-peroxidic oxygen, sulfur, non-phosphino phosphorus, non-amino nitrogen, halogen, silicon, and 3) a mono- or divalent fluorocarbon group having 3 to 12,500 carbon atoms and 5 to 25,000 fluorine atoms corresponding to the formulae III and IV:

$$F_3C(CFX)_aA(CFX)_bCH_2— \qquad III$$

where A is a carbon-to-carbon bond, in which case a is an integer from 1 to 30 and b is zero, or A is —O—(—CFX—CF$_2$—O—)$_c$ in which case a is an integer from 1 to 10, b is one, and c is an integer from 1 to 100, and X is fluorine or perfluoroalkyl having 1 to 10 carbon atoms;

$$—CH_2(CFX)_aB(CFX)_bCH_2— \qquad IV$$

where B is 1) a carbon-to-carbon bond, in which case a is an integer of 1 to 30 and b is zero, or 2) B is [(CFX)$_d$O(CFX)$_u$]$_v$, in which case a and b are zero, d and u are integers of 1 to 30, and v is an integer of 1 to 20, or 3) B is (OCF$_2$—CFX)$_w$O(CFX)$_h$O(CFX—CF$_2$O)$_i$, in which case a and b are 1, h is an integer of 1 to 10, and w and i are integers of 1 to 100, or 4) B is [(CF$_2$CH$_2$)$_j$(CF$_2$—CFX)$_k$]$_m$, in which case a and b are each integers of 1 to 10j and k are integers whose ratio j/k is 1/1 to 1/10, m is an integer of 1 to 100, and (CF$_2$CH$_2$) and (CF$_2$—CFX) are randomly distributed units; and where X is fluorine or perfluoroalkyl of 1 to 10 carbon atoms.

In the practice of this invention, a combination of cyanate monomers can be used whereby such combination is comprised of one or more cyanates of Formula II and oligomers thereof, where p is 2 to 7 and oligomers thereof, and optionally one or more monofunctional cyanates (e.g. Formula II where p is one). Examples of cyanates are as follows cyanatobenzene, 1,3- and 1,4-dicyanatobenzene, 2-tert-butyl-1,4-dicyanatobenzene, 2,4-dimethyl-1,3-dicyanatobenzene, 2,5-di-tert-butyl-1,4-dicyanatobenzene, tetramethyl-1,4-dicyanatobenzene, 4-chloro-1,3-dicyanatobenzene, 1,3,5-tricyanatobenzene, 2,2'- or 4,4'-dicyanatobiphenyl, 3,3',5,5'-tetramethyl-4,4'dicyanatobiphenyl, 1,3-, 1,4-, 1,5-, 1,6-, 1,8-, 2,6-, or 2,7-dicyanatonaphthalene, 1,3,6-tricyanatonaphthalene, bis(4-cyanatophenyl)methane, bis(3-chloro-4-cyanatophenyl)methane, 2,2-bis(4-cyanatophenyl)propane, 2,2-bis(3,5-dichloro-4-cyanatophenyl)propane, 2,2-bis(3,5-dibromo-4-cyanatophenyl)propane, bis(4-cyanatophenyl)ether, bis(p-cyanophenoxyphenoxy)benzene, di(4-cyanatophenyl)ketone, bis(4-cyanatophenyl)thioether, bis(4-cyanatophenyl)sulfone, tris(4-cyanatophenyl)phosphite, and tris(4-cyanatophenyl)phosphate. Also useful are cyanic acid esters derived from phenolic resins (U.S. Pat. No. 3,962,184), cyanated novolak derived from novolak (U.S. Pat. No. 4,022,755), cyanated bisphenol type polycarbonate oligomer derived from bisphenol types polycarbonate oligomer (U.S. Pat. No. 4,026,913), cyanato-terminated polyaryleneethers (U.S. Pat. No. 3,595,900), dicyanate esters free of ortho hydrogen atoms (U.S. Pat. No. 4,740,584), mixtures of di- and tricyanates (U.S. Pat. No. 4,709,008), polyaromatic cyanates containing polycyclic aliphatic diradicals such as XU71787 TM , Dow Chemical Co. (U.S. Pat. No. 4,528,366), fluorocarbon cyanates (U.S. Pat. No. 3,733,349), and other novel cyanate compositions (U.S. Pat. Nos. 4,195,132 and 4,116,946), all of which are incorporated herein by reference.

Polycyanate compounds obtained by reacting a phenolformaldehyde precondensate with a halogenated cyanide are also useful.

The curing agent can be present in the range of 0.01 to 20, preferably 0.1 to 10 weight percent of the total composition.

The present invention also provides a process for the polymerization of cyanate monomers, comprising the steps of:

(a) providing at least one cyanate monomer;

(b) adding to the monomer a catalytically effective amount of a curing agent comprising an organometallic compound, and a solvent in the amount of zero to 99 weight percent (and all permutations of the order of mixing the aforementioned components), thereby forming a polymerizable mixture, and (c) allowing the mixture to polymerize or adding energy to the mixture to effect polymerization.

In a further aspect, there is also provided a method for preparing coated articles containing the cured composition of the invention comprising the steps of:

(a) providing a substrate, (b) coating an energy polymerizable mixture as described above onto at least one surface of said substrate by methods known in the art, such as bar, knife, reverse roll, knurled roll, or spin coatings, or by dipping, spraying, brushing, and the like, with or without a coating solvent, and (c) applying energy (after evaportion of solvent if present) to the article to effect the polymerization of the coating.

In a still further aspect, there are also provided shaped articles comprising the polymerizable mixture of the invention. The articles can be provided, for example, by techniques such as molding, injection molding, casting, and extrusion. Applying energy to the mixture causes polymerization and provides the cured shaped article.

It may be desirable to add solvent to solubilize components and aid in processing. Solvent, preferably organic solvent, in an amount up to 99 weight percent, but preferably in the range of 0 to 90 weight percent, most preferably in the range of 0 to 75 weight percent, of the polymerizable composition can be used.

Representative solvents include acetone, methyl ethyl ketone, tetrahydrofuran, cyclopentanone, methyl cellosolve acetate, methylene chloride, nitromethane, methyl formate, acetonitrile, gamma-butyrolactone, and 1,2-dimethoxyethane (glyme). In some applications, it may be advantageous to sorb the curing agent onto an inert support such as silica, alumina, clays, etc., as described in U.S. Pat. No. 4,677,137.

In general, thermally induced polymerization of cyanate monomers with organometallic compounds may be carried out at 80° to 250° C. (preferably 80° to 150° C.). In general, radiation-induced polymerization of cyanate monomers with latent curing agents comprising an organometallic compound can be carried out at 25° to 300° C., preferably at 80° to 125° C. for the majority of energy curable compositions, although low temperature (e.g., 25° to 80° C.) or elevated temperature (e.g., 125° to 300° C., preferably 125° to 200° C.) can be used to subdue the exotherm of polymerization or to accelerate the polymerization, respectively.

Temperature of polymerization and amount of curing agent (catalyst) will vary and be dependent on the particular curable composition used and the desired application of the polymerized or cured product. The amount of curing agent to be used in this invention should be sufficient to effect polymerization of the monomers or precursors (i.e., a catalytically-effective amount) under the desired use conditions. Such amount generally will be in the range of about 0.01 to 20 weight percent, and preferably 0.1 to 10.0 weight percent, based on the weight of curable composition.

For those compositions of the invention which are radiation-sensitive, i.e., the compositions containing cyanate monomers, and as curing agent an organometallic compound of Formula I, any source of radiation including electron beam radiation and radiation sources emitting active radiation in the ultraviolet and visible region of the spectrum (e.g., about 200 to 800 nm) can be used. Suitable sources of radiation include mercury vapor discharge lamps, carbon arcs, tungsten lamps, xenon lamps, lasers, sunlight, etc. The required amount of exposure to effect polymerization is dependent upon such factors as the identity and concentration of the organometallic compound, the particular cyanate monomer, the thickness of the exposed material, type of substrate, intensity of the radiation source and amount of heat associated with the radiation. Thermal polymerization using direct heating or infrared electromagnetic radiation, as is known in the art, can be used to cure cyanate monomers according to the teachings of this invention.

It is within the scope of this invention to include two-stage polymerization (curing), which is well known in the art, by first activating the curing agent by irradiating the curable compositions and subsequently thermally curing the activated precursors so obtained, the irradiation temperature being below the temperature employed for the subsequent heat-curing. These activated precursors may normally be cured at temperatures which are substantially lower than those required for the direct thermal curing, with an advantage in the range from 50° to 150° C. This two-stage curing also makes it possible to control the polymerization in a particularly simple and advantageous manner.

It may be desirable to protect the polymerizable composition of the invention from light and heat as by use of shielding or filters known in the art until polymerization and cure are desired.

Adjuvants such as solvents, pigments, abrasive granules, stabilizers, light stabilizers, antioxidants, flow agents, bodying agents, flatting agents, colorants, inert fillers, binders, blowing agents, fungicides, bacteriocides, surfactants, plasticizers, and other additives as known to those skilled in the art can be added to the compositions of this invention. These can be added in an amount effective for their intended purpose. Generally, the amount of such adjuvants is in the range of 0.001 to 99.9 weight percent.

Compositions of this invention may be applied, preferably as a liquid, to a substrate such as steel, aluminum, copper, cadmium, zinc, glass, ceramic, paper, wood, or various plastic films such as poly(ethylene terephthalate), plasticized poly(vinylchloride), poly(propylene), poly(ethylene), and the like, and irradiated.

In a preferred embodiment, the polymerizable composition can be used as a resin in graphic arts preparations. By polymerizing part of the coating, for example as by irradiation through a mask or by use of a thermal imaging device, those portions which have not been polymerized may be washed with a solvent to remove the unpolymerized portions while leaving the polymerized, insoluble portions in place. Thus, compositions of this invention may be used in the production of articles useful in the graphic arts such as printing plates and printed circuits. Methods of producing printing plates and printed circuits from photopolymerizing compositions are well known in the art (see for example British Patent Specification No. 1,495,746).

Objects and advantages of this invention are further illustrated by the following examples, but the particular materials and amounts thereof recited in these examples, as well as other conditions and details, should not be construed to unduly limit this invention. In the Examples, Cp means eta$^5$-cyclopentadienyl, Ph means phenyl, Me means methyl, and NBD means eta$^4$-norbornadiene.

EXAMPLE 1

A number of salts of organometallic complex cations of the general formula (eta$^5$-cyclopentadienyl)M(eta$^6$-arene)$^+$ where M=Fe or Ru were evaluated as catalysts in the polymerization of an aromatic dicyanate, namely 2,2-bis(4-cyanatophenyl)propane (Hi-Tek Polymers, Inc., Louisville, Ky.). Thermal catalytic activity was assayed by differential scanning calorimetry (DSC) and photocatalytic activity was assayed by differential photocalorimetry (DPC) using a thermal analyzer Model 9900, differential scanning calorimeter, Model 912, differential photocalorimeter, Model 930, all available from E.I. duPont de Nemours and Company, Inc., Wilmington, Del.

Samples were prepared by weighing solid 2,2-bis(4-cyanatophenyl)propane (approximately 0.3 g) and catalyst (approximately 0.005 g) into polystyrene vials, a plexiglass ball was added and the samples were ground in a WIG-L-BUG ™ (Cresent Dental) vibrating grinder/mixer.

For DSC experiments, small quantities (5–10 mg) of the resulting powder samples were weighed into aluminum liquid sample pans which were hermetically sealed in a sample press. No effort was made to protect the samples from air. The sealed sample pans were placed in the DSC cell; two samples were run concurrently. The samples were heated from ambient temperature to 400° C. at a rate of 10° C. per minute The data, heat flow (watts/g) vs. temperature (° C.), was analyzed by the curve fitting software supplied with the Model 9900 thermal analyzer to give the onset temperature, peak temperature, and total energy (J/g) for the endotherms and exotherms of interest. All samples showed an endotherm with approximate onset and peak temperatures of 80 and 84° C., respectively. This corresponds to the melting of 2,2-bis(4-cyanatophenyl)propane and may be used as an internal standard for these experiments. The samples then showed exotherms, the software handled data of which showed various shapes at various temperatures which correspond to the polymerization of 2,2-bis(4-cyanatophenyl)propane. These curves were compared to those obtained for the monomer in the absence of any catalyst. Representative samples were ramped to 400° C. a second time and in all cases a flat line was obtained for the DSC curve. This was taken as evidence for complete polymerization in the initial DSC runs For DPC experiments, small quantities (6–12 mg) of the powder samples were weighed into aluminum liquid sample pans; no effort was made to protect the samples from air. The open sample pans were placed in the DPC cell; two samples were run concurrently. The samples were heated from ambient temperature to 400° C. at a rate of 10° C. per minute. Above approximately 250° C., downward sloping baselines were obtained, presumably due to sample volatilization. During the course of the heating, the samples were irradiated through the quartz DPC cell cover with the unfiltered light from a 200 watt medium pressure Hg lamp. The irradiation system contained a feedback mechanism to insure that the samples received a constant light flux. The DPC cell was purged with a gentle stream of nitrogen. The data, heat flow (watts/g) vs. temperature (° C.), was analyzed by the curve fitting software supplied with the Model 9900 thermal analyzer to give the onset temperature, peak temperature, and total energy (J/g) for the endotherms and exotherms of interest. This is the standard method to treat DSC data; these trials were essentially DSC runs with concurrent irradiation. All samples showed an endotherm with approximate onset and peak temperatures of 80° and 84° C., respectively. This corresponded to the melting of 2,2-bis(4-cyanatophenyl)propane and may be used as an internal standard for these experiments. The samples then showed exotherms, the software handled data of which showed various shapes at various temperatures which corresponded to the polymerization of 2,2-bis(4-cyanatophenyl)propane. These curves were compared to those obtained for the monomer in the absence of any catalyst.

In both trials, the sample pans at the end of each run generally contained a hard, glassy polymer with colors ranging from almost black to pale amber. The results of the DSC and DPC studies, expressed in terms of the onset and peak (indicated in parentheses) temperatures for the polymerization, are summarized in Table I, below.

TABLE I

| Catalyst | Mol % | Wt % | Thermal onset (peak) (°C.) | Photo onset (peak) (°C.) |
|---|---|---|---|---|
| None (Comparative) | 0.0 | 0.0 | 307(327) | 283(302) |
| [CpRu(eta$^6$-benzene)$^+$]PF$_6^-$ | 0.6 | 0.9 | 236(261) | 233(264) |
| [Cp*Fe(eta$^6$-toluene)$^+$]PF$_6^-$ | 0.3 | 0.4 | 238(250) | 124(173) |
| [CpFe(eta$^6$-pyrene)$^+$]PF$_6^-$ | 0.8 | 1.4 | 117(134) | 86(110) |
| [CpFe(eta$^6$-naphthalene)$^+$]AsF$_6^-$ | 0.4 | 0.8 | 124(131) | 83(110) |
| [CpFe(eta$^6$-fluorene)$^+$]PF$_6^-$ | 0.4 | 0.6 | 186(195) | 86(114) |
| [CpFe(eta$^6$-benzene)$^+$]AsF$_6^-$ | 1.4 | 1.9 | 177(199) | 90(114) |
| [CpFe(eta$^6$-mesitylene)$^+$]SbF$_6^-$ | 0.7 | 1.3 | 175(189) | 84(111) |

Cp* means eta$^5$-pentamethylcyclopentadienyl

Lower onset and peak temperatures for polymerization are evidence of more efficient catalysts.

The above data show that the salts of organometallic complex cations were active catalysts for the thermal polymerization of dicyanates and that the catalysts were more effective in the presence of light. Additionally, the data show that the nature of the arene and cyclopentadienyl ligands affected the thermal catalytic activity of the salts. In addition, the data show that the nature of the metal affected the catalytic activity of the salts.

EXAMPLE 2

Five salts of organometallic complex cations of the general formula CpFe(eta$^6$-mesitylene)$^+$X$^-$ where X = BF$_4$, AsF$_6$, PF$_6$, SbF$_6$, or CF$_3$SO$_3$ were evaluated as catalysts following the procedure of Example 1. Hard, glassy polymers with colors ranging from almost black to pale amber were again obtained. The results are summarized in Table II, below.

TABLE II

| Catalyst | Mol % | Wt % | Thermal onset (peak) (°C.) | Photo onset (peak) (°C.) |
|---|---|---|---|---|
| None (Comparative) | 0.0 | 0.0 | 307(327) | 283(302) |
| [CpFe(eta$^6$-mesitylene)$^+$]BF$_4^-$ | 0.5 | 0.6 | 179(194) | 105(131) |
| [CpFe(eta$^6$-mesitylene)$^+$]AsF$_6^-$ | 0.5 | 0.8 | 177(204) | 87(115) |
| [CpFe(eta$^6$-mesitylene)$^+$]CF$_3$SO$_3^-$ | 0.8 | 1.2 | 174(196) | 87(114) |
| [CpFe(eta$^6$-mesitylene)$^+$]PF$_6^-$ | 0.6 | 0.9 | 191(197) | 85(113) |
| [CpFe(eta$^6$-mesitylene)$^+$]SbF$_6^-$ | 0.7 | 1.3 | 175(189) | 84(111) |

The data of Table II show that the catalytic activity of the salts of organometallic complex cations was not greatly affected by the anionic counterion.

EXAMPLE 3

Three organometallic complexes of the general formula (eta$^5$-cyclopentadienyl)Fe(L$^2$)$_3^+$ wherein L$^2$ is a ligand as described in Formula I were evaluated as catalysts following the procedure of Example 1. Hard, glassy polymers with colors ranging from almost black to pale amber were again obtained The results are summarized in Table III, below.

TABLE III

| Catalyst | Mol % | Wt % | Thermal onset (peak) (°C.) | Photo onset (peak) (°C.) |
|---|---|---|---|---|
| None (comparative) | 0.0 | 0.0 | 307(327) | 283(302) |
| [(eta$^5$-C$_6$H$_7$)Fe(CO)$_3$$^+$]PF$_6$$^-$ | 0.6 | 0.8 | 203(216) | 98(140) |
| [CpFe(CO)$_3$$^+$]PF$_6$$^-$ | 0.8 | 1.0 | 155(187) | 86(140) |
| [CpFe(CO)$_2$(PPh$_3$)$^+$]AsF$_6$$^-$ | 0.3 | 0.7 | 199(224) | 90(114) |

This example shows that the (eta$^5$-cyclopentadienyl)-Fe(L$^2$)$_3$+ or (eta$^5$-cyclohexadienyl)Fe(L$^2$)$_3$+ (eta$^5$-pentadienyl)Fe(L$^2$)$_3$+ complexes were effective thermal and photocatalysts for the curing of polyfunctional cyanates. Furthermore the nature of the ligands attached to the Fe affected the thermal and photocatalytic ability of the complexes.

EXAMPLE 4

Four neutral organometallic compounds were evaluated as catalysts following the procedure in Example 1. Hard, glassy polymers with colors ranging from almost black to pale amber were again obtained. The results are summarized in Table IV, below.

TABLE IV

| Catalyst | Mol % | Wt % | Thermal onset (peak) (°C.) | Photo onset (peak) (°C.) |
|---|---|---|---|---|
| None (comparative) | 0.0 | 0.0 | 307(327) | 283(302) |
| [Cp*Fe(CO)$_2$]$_2$ | 0.6 | 1.0 | 106(123) | 97(118) |
| [CpFe(CO)$_2$]$_2$ | 0.6 | 0.8 | 101(110) | 89(102) |
| CpFe(CO)$_2$SnPh$_3$ | 0.4 | 0.7 | 173(187) | 89(122) |
| CpFe(CO)$_2$Cl | 1.8 | 1.4 | 88(99) | 81(90) |

Cp* see Example 1

The data of Table IV show that the neutral organometallic compounds were effective thermal and photocatalysts for the curing of polyfunctional cyanates. Furthermore, the data show the nature of the ligands attached to Fe affected the thermal and photocatalytic ability of the complexes.

EXAMPLE 5

Six neutral organometallic carbonyl compounds were evaluated as catalysts following the procedure in Example 1. Hard, glassy polymers with colors ranging from almost black to pale amber were again obtained. The results are summarized in Table V, below.

TABLE V

| Catalyst | Mol % | Wt % | Thermal onset (peak) (°C.) | Photo onset (peak) (°C.) |
|---|---|---|---|---|
| None (comparative) | 0.0 | 0.0 | 307(327) | 283(302) |
| W(CO)$_6$ | 2.5 | 3.2 | 177(229) | 192(226) |
| Ru$_3$(CO)$_{12}$ | 0.4 | 0.9 | 172(222) | 181(226) |
| Re$_2$(CO)$_{10}$ | 2.2 | 5.2 | 176(181) | 124(156) |
| Mn$_2$(CO)$_{10}$ | 1.5 | 2.1 | 145(150) | 95(122) |
| Fe$_3$(CO)$_{12}$ | 1.2 | 2.8 | 88(94) | 90(95) |
| Fe$_2$(CO)$_9$ | 1.2 | 1.5 | 83(88) | 83(97) |

The data of Table V show that the metal carbonyl complexes were active catalysts for the thermal polymerization of dicyanates and that they were effective in the presence of light. Additionally, it is apparent from this example that the nature of the metal affected the catalytic activity of the complexes.

EXAMPLE 6

Five neutral organometallic compounds were evaluated as catalysts following the procedure in Example 1. Hard, glassy polymers with colors ranging from almost black to pale amber were again obtained. The results are summarized in Table VI, below.

TABLE VI

| Catalyst | Mol % | Wt % | Thermal onset (peak) (°C.) | Photo onset (peak) (°C.) |
|---|---|---|---|---|
| None (comparative) | 0.0 | 0.0 | 307(327) | 283(302) |
| [CpW(CO)$_3$]$_2$ | 0.4 | 0.9 | 168(220) | 151(188) |
| (eta$^6$-benzene)Cr(CO)$_3$ | 1.5 | 1.2 | 149(207) | 114(150) |
| (MeCp)Mn(CO)$_3$ | 8.2 | 6.5 | 169(253) | 103(157) |
| [CpMo(CO)$_3$]$_2$ | 1.1 | 1.8 | 129(145) | 101(141) |
| CpMn(CO)$_3$ | 3.4 | 1.7 | 240(270) | 99(132) |

The data of Table VI show that the neutral organometallic compounds were active catalysts for the thermal polymerization of dicyanates and that they were more effective in the presence of light. Additionally, the data of Table VI show that the nature of the metal and the nature of the polyene affected the thermal and photocatalytic activity of the complexes.

EXAMPLE 7

Four organometallic compounds containing halogen ligands were evaluated as catalysts following the procedure in Example 1. Hard, glassy polymers with colors ranging from almost black to pale amber were again obtained. The results are summarized in Table VII, below.

TABLE VII

| Catalyst | Mol % | Wt % | Thermal onset (peak) (°C.) | Photo onset (peak) (°C.) |
|---|---|---|---|---|
| None (comparative) | 0.0 | 0.0 | 307(327) | 283(302) |
| [(eta$^6$-C$_6$H$_6$)Ru(CH$_3$CN)$_2$-Cl$^+$]AsF$_6$$^-$ | 0.3 | 0.6 | 225(269) | 224(260) |
| (CO)$_5$ReBr | 0.9 | 1.3 | 189(234) | 185(217) |
| (Cp)$_2$Ti(Cl)$_2$ | 1.2 | 1.0 | 208(227) | 163(186) |
| [(eta$^6$-p-cymene)Ru(Cl)$_2$]$_2$ | 0.6 | 1.2 | 142(162) | 144(162) |

The data of Table VII show that halogen containing organometallic compounds were active catalysts for the thermal polymerization of dicyanates and that they were effective in the presence of light. Additionally, it is apparent from these data that the nature of the metal and the nature of the ancillary ligands affected the catalytic activity of the complexes.

EXAMPLE 8

Nine other organometallic compounds were evaluated as catalysts following the procedure in Example 1. Hard, glassy polymers with colors ranging from almost black to pale amber were again obtained. The results are summarized in Table VIII, below.

TABLE VIII

| Catalyst | Mol % | Wt % | Thermal onset (peak) (°C.) | Photo onset (peak) (°C.) |
|---|---|---|---|---|
| None (comparative) | 0.0 | 0.0 | 307(327) | 283(302) |
| [(Cp)$_2$Co$^+$]PF$_6$$^-$ | 0.7 | 0.9 | 240(295) | 226(280) |
| [(MeCp)Mn(CO)$_2$NO$^+$]PF$_6$$^-$ | 1.1 | 1.5 | 265(299) | 223(262) |
| [(NBD)Rh(PPh$_3$)$_2$$^+$]PF$_6$$^-$ | 0.3 | 1.0 | 206(263) | 211(271) |

TABLE VIII-continued

| Catalyst | Mol % | Wt % | Thermal onset (peak) (°C.) | Photo onset (peak) (°C.) |
|---|---|---|---|---|
| (Cp)₂Fe | 3.8 | 2.6 | 161(193) | 164(192) |
| [(eta⁶-hexamethyl-benzene)₂Fe⁺²][PF₆⁻]₂ | 0.5 | 1.1 | 222(236) | 150(186) |
| CpPt(CH₃)₃ | 3.5 | 3.9 | 137(177) | 140(180) |
| CpW(CO)₃CH₃ | 1.1 | 1.4 | 183(210) | 137(197) |
| [(Cp)₂Fe⁺]AsF₆⁻ | 0.7 | 0.9 | 105(150) | 110(153) |
| [(CpFe)₂(eta⁶-fluorene)⁺²]-[AsF₆⁻]₂ | 0.3 | 1.0 | 160(174) | 87(114) |

The data of Table VIII provide further examples of organometallic compounds, including salts of organometallic complex dications, which were effective thermal and photocatalysts for the cyclotrimerization of cyanates.

The data also show that complexes containing metal-alkyl sigma bonds were effective catalysts.

EXAMPLE 9

Six samples were prepared as in Example 1. Sample A contained bis(4-cyanato-3,5-dimethylphenyl)methane alone.

Sample B contained bis(4-cyanato-3,5-dimethylphenyl)methane (0.3010 g) and CpFe(eta⁶-mesitylene)⁺CF₃SO₃⁻ (0.0036 g).

Sample C contained bis(4-cyanato-3,5-dimethylphenyl)methane (0.3772 g) and CpFe(CO)₂SnPh₃ (0.0033 g).

Sample D contained 1,1'-bis(cyanato)biphenyl alone.

Sample E contained 1,1'-bis(cyanato)biphenyl (0.1494 g) and CpFe(eta⁶-mesitylene)⁺CF₃SO₃⁻ (0 0015 g).

Sample F contained 1,1'-bis(cyanato)biphenyl (0.1290 g) and CpFe(CO)₆₂SnPh₃ (0.0022 g).

Three samples were prepared by dissolving catalysts into a liquid dicyanate resin (ESR-310 TM, Hi-Tek Polymers, Inc.). Sample G contained ESR-310 alone. Sample H contained ESR-310 (1.4804 g) and Fe₂(CO)₆₉ (0.0048 g). Sample I contained ESR-310 (1.2001 g) and CpFe(CO)₆₂Cl (0.0030 g). All nine samples were evaluated for catalytic activity following the procedure in Example 1. Hard, glassy polymers with colors ranging from almost black to pale amber were again obtained. The results are summarized in Table IX, below.

TABLE IX

| Sample | Catalyst | Monomer | Thermal onset (peak) (°C.) | Photo onset (peak) (°C.) |
|---|---|---|---|---|
| A | None | bis(4-cyanato-3,5-dimethyl-phenyl)methane | 286(340) | 293(318) |
| B | CpFe(eta⁶-mesitylene)⁺CF₃SO₃- | bis(4-cyanato-3,5-dimethyl-phenyl)methane | 202(217) | 109(155) |
| C | CpFe(CO)₂-SnPh₃ | bis(4-cyanato-3,5-dimethyl-phenyl)methane | 231(242) | 109(140) |
| D | None | 1,1'-bis-(cyanato)-biphenyl | 153(187) | 160(185) |
| E | CpFe(eta⁶-mesitylene)⁺CF₃SO⁻₃ | 1,1'-bis(cyanato)-biphenyl | 158(185) | 128(134) |
| F | CpFe(CO)₂-SnPh₃ | 1,1'-bis-(cyanato)-biphenyl | 130(160) | 128(134) |
| G | None | ESR-310 | 223(289) | 257(298) |
| H | Fe₂(CO)₉ | ESR-310 | 92(110) | 87(101) |
| I | CpFe(CO)₂Cl | ESR-310 | 97(110) | 86(104) |

The data of Table IX show that a variety of cyanate monomers were cured thermally and photochemically by the organometallic catalyst system.

EXAMPLE 10

A sample containing 10 mg of [CpFe(CO)₂]₂, 1.0 g of 2,2-bis(4-cyanatophenyl)propane, and 1.0 ml of gamma-butyrolactone was prepared and placed in a 90° C. oven. The sample was periodically observed and was found to form a solid polymeric mass within 52 minutes. This example demonstrated that [CpFe(CO)₂]₂ was a thermal catalyst for the polymerization of cyanate monomers and that the polymerization could be carried out in the presence of solvent.

EXAMPLE 11

A sample containing 10 mg of CpFe(eta⁶-pyrene)⁺PF₆⁻ and 1.0 g 2,2-bis(4-cyanatophenyl)propane was heated gently to 90° C. for two minutes to give a homogeneous solution of cyanate monomer and catalyst. The sample was placed in a 120° C. oven and observed periodically. The sample was found to form a solid polymeric mass within 60 minutes. This example demonstrated that CpFe(eta⁶-pyrene)⁺PF₆⁻ was a thermal catalyst for the polymerization of cyanate monomers and that the polymerization could be carried out on 100% solids compositions.

EXAMPLE 12

A sample containing 1.0 g of 2,2-bis(4-cyanatophenyl)propane, 1.0 ml of gamma-butyrolactone, and 10 mg of CpFe(eta⁶-mesitylene)⁺PF₆⁻ was placed in a vial under subdued light. The sample was gently warmed (in the dark) to complete dissolution of the solids and then was irradiated with light from a Kodak Carousel TM Projector (Eastman Kodak Co., Rochester, N.Y.) while being held at approximately 100° C. in an oven.

The sample cured to a solid mass within 45 minutes. An identical sample was held at approximately 100° C. in the dark; no increase in viscosity could be detected visually after 4 hours which was taken as evidence that little or no polymerization had occurred. This example demonstrated the photochemical component in the catalysis of the polymerization of cyanate monomers by CpFe(eta⁶-mesitylene)⁺PF₆⁻. It also showed that the photocuring could be carried out in the presence of solvent and that visible light was useful in the polymerization.

EXAMPLE 13

A sample containing 1.0 g of 2,2-bis(4-cyanatophenyl)propane, 1.0 ml of gamma-butyrolactone, and 10 mg of CpFe(eta⁶-fluorene)⁺PF₆⁻, was placed in a vial under subdued light. The sample was gently warmed (in the dark) to complete dissolution of the solids and then was irradiated with light from a Kodak Carousel Projector while being held at approximately 100° C. in an oven. The sample cured to a solid mass within 45 minutes. An identical sample was held at approximately 100° C. in the dark; no increase in viscosity could be detected visually after 4 hours which was taken as evidence that little or no polymerization had occurred. This example demonstrated the photochemical component in the catalysis of the polymerization of cyanate monomers by $CpFe(eta^6\text{-fluorene})^+PF_6^-$. It also showed that the photocuring could be carried out in the presence of solvent and that visible light was useful in the polymerization.

EXAMPLE 14

A stock solution of 2.0 g of 2,2-bis(4-cyanatophenyl)propane and 2.0 g of tetrahydrofuran (THF) was prepared. Three samples were then prepared and sealed as follows: (A) 1.0 g of stock solution and 0.02 g of $(MeCp)Mn(CO)_3$; (B) 1.0 g of stock solution and 0.02 g of $(MeCp)Mn(CO)_3$; and (C) 1.0 g of stock solution. Samples (A) and (C) were irradiated for 15 minutes at room temperature using two GE Blak-ray 15 watt blacklights (primary wavelength 366 nm) (General Electric Co., Schenectady, N.Y.) and sample (B) was placed in the dark at room temperature. The solution in sample (A) changed color from yellow to purple while samples (B) and (C) remained unchanged. All three samples were then heated in the dark by placing them in a 100° C. water bath. Sample (A) was cured to a solid material in 20 minutes while samples (B) and (C) were unchanged after 3.5 hours. This example demonstrated that the curing of cyanate monomers could be accomplished in two stages; photochemical activation of the catalyst species followed by a later thermal curing step. It further demonstrated that the two stage curing could be carried out in the presence of solvent and that ultraviolet light was useful in the polymerization.

EXAMPLE 15

Two samples, each 0.5 g, were prepared containing 1 part $(MeCp)Mn(CO)_3$ and 200 parts 2,2-bis(4-cyanatophenyl)propane and placed in glass vials. Each sample was gently warmed (in the dark) to complete dissolution of the solids and gave pale yellow homogenoeus solutions. One sample was irradiated for 10 minutes at room temperature using two GE Blak-ray 15 watt black lights (primary wavelength 366 nm) and one sample was kept in the dark at room temperature. Both were then placed in an 85° C. oven and were observed periodically. The sample which had been irradiated cured to a solid polymeric mass within 45 minutes while the sample which was not irradiated was still fluid after four hours. This example demonstrated that the curing of cyanate monomers could be accomplished in two stages; photochemical activation of the catalyst species followed by a later thermal curing step. It further demonstrated that the two stage curing could be carried out with 100% solids compositions and that ultraviolet light was useful in the polymerization.

EXAMPLE 16

Two samples, 0.5 g each, were prepared containing 1 part $CpFe(eta^6\text{-mesitylene})^+PF_6^-$ and 200 parts 2,2-bis(4-cyanatophenyl)propane and placed in glass vials. Each sample was heated in an oven at 120° C. for 3 minutes, to form a light yellow, fluid, homogeneous solution. One sample was removed from the oven and irradiated for 1 minute using a Kodak Carousel projector ("A" stage), then returned to the oven ("B" stage). The irradiated sample cured to a glassy black solid in 6 minutes, while the sample which was not irradiated was unchanged after 45 minutes at 120° C. This example demonstrated that the photocuring of cyanate monomers could be accomplished in two stages; photochemical activation of the catalyst species followed by a later thermal curing step. It further demonstrated that the two stage curing could be carried out on 100% solids compositions and that visible light was useful in the process.

EXAMPLE 17

A 3.3 g sample containing 1 part $CpFe(eta^6\text{-mesitylene})^+PF_6^-$ and 200 parts 2,2-bis(4-cyanatophenyl)propane was prepared in a glass vial. This was placed in an oven at 120° C. for 6 minutes yielding a light yellow, homogeneous, fluid (i.e., processable) solution. This solution was poured into a cylindrical polytetrafluoroethylene (Teflon TM, DuPont) mold (which had been heated to 120° C.) and was irradiated for 1 minute with a Kodak Carousel projector. The mold was returned to the oven at 120° C.; the sample cured in 5.5 minutes to give a black, glassy, cylinder. This example demonstrated that the two stage curing process could be used to prepare shaped articles. It further demonstrated that the process could be carried out with 100% solids compositions and that visible light was useful in the process.

EXAMPLE 18

An ethyl acetate solution (5.0 ml) containing 1.0 g of partially trimerized bis(4-cyanatophenyl)thioether resin, (AroCy T-30 TM, Hi-Tek Polymers, Inc.), was prepared and $(MeCp)Mn(CO)_3$ (0.01 g) was added. The resulting mixture was coated on an aluminum Alodined TM brand, Q-panel (Q-panel Company, Cleveland, Ohio) using a #22 wire wound bar. The panel was placed in a 100° C. oven for one minute to evaporate the solvent, and yielded a tack-free coating. A #1-T Resolution Guide (Stouffer Graphic Arts Equipment Company, South Bend, Ind.) was placed on top of the coating and the construction was irradiated at ambient (room) temperature for 3 minutes with two GE Blakray 15 watt blacklights. The Resolution Guide was removed and the exposed Q-panel was placed in a 100° C. oven for 5 minutes. The panel was then rinsed with methyl ethyl ketone, leaving a negative image of the Resolution Guide.

This example demonstrated that coatings of cyanate monomers could be cured using the neutral organometallic compounds of the present invention and that the curing could be accomplished in two stages. It further demonstrated that the coatings could be accomplished in an image-wise fashion.

EXAMPLE 19

A methyl ethyl ketone (MEK) solution (5.0 ml) containing 1.0 g of partially trimerized 2,2-bis(4-cyanatophenyl)propane resin (AroCy B-50 TM, Hi-Tek Polymers, Inc.) was prepared and $CpFe(eta^6\text{-mesitylene})^+CF_3SO_3^-$ (0.006 g) was added. The mixture was coated on an Alodined aluminum Q-panel using a #20 wire wound bar. The panel was air dried in the dark for one hour to evaporate the MEK and give a tack-free coating. The coating was exposed through a 21 step sensitivity guide (Stouffer Graphic Arts Equipment Company) for 4 minutes with two GE Blak-ray 15 watt blacklights. The exposed sample was placed in a 110° C. oven for 5 minutes. The panel was then rinsed with MEK, leaving a negative image of the sensitivity guide (eight solid steps, one ghost).

This example demonstrated that coatings of cyanate resins could be cured by the salts of organometallic complex cations of the present invention and that the curing could be accomplished in an image-wise fashion in two stages.

EXAMPLE 20

An MEK solution (5.0 ml) containing 1.0 g of partially trimerized 2,2-bis(4-cyanatophenyl)propane resin (AroCy B-50) was prepared and CpFe(CO)$_2$SnPh$_3$ (0.01 g) was added. The mixture was coated on poly(vinylidene chloride)-primed polyester film (Scotch Par ™, 3M, St. Paul, Minn.) using a #20 wire wound bar. The film was air dried in the dark for one hour to evaporate the MEK and give a tack-free coating. The coating was exposed through a #1-T Resolution Guide for 5 minutes with two GE Blak-ray 15 watt blacklights. The exposed film was placed in a 110° C. oven for 5 minutes. The film was then rinsed with MEK, leaving a negative image of the Resolution Guide.

This example demonstrated that coatings of cyanate resins on polymeric substrates could be cured by the organometallic catalysts of the present invention and that the curing could be accomplished in an image-wise fashion in two stages.

Various modifications and alterations of this invention will become apparent to those skilled in the art without departing from the scope and spirit of this invention, and it should be understood that this invention is not to be unduly limited to the following illustrative embodiments set forth herein.

We claim:

1. An energy polymerizable composition consisting essentially of at least one cyanate monomer or oligomer comprising an organic radical bonded through carbon atoms to at lest two —OCN groups and as curing agent a transition-metal containing organometallic compound in which at least one carbon atom of an organic group is bonded to the metal atom.

2. The composition according to claim 1 wherein said organometallic compound has the formula:

$$[L^2L^2L^3M]^{+e} \cdot X_f \qquad \text{I}$$

$L^1$ represents none, or 1 to 12 ligands contributing pi-electrons that can be the same or different selected from substituted and unsubstituted acyclic and cyclic unsaturated compounds and groups and substituted and unsubstituted carbocyclic aromatic and heterocyclic aromatic compounds, each capable of contributing 2 to 24 pi-electrons to the valence shell of M;

$L^2$ represents none, or 1 to 24 ligands that can be the same or different contributing an even number of sigma-electrons selected from mono-, di-, and tridentate ligands, each donating 2, 4, or 6 sigma-electrons to the valence shell of M;

$L^3$ represents none, or 1 to 12 ligands that can be the same or different, each contributing no more than one sigma-electron each to the valence shell of each M;

M represents 1 to 4 of the same or different metal atoms selected from the elements of Periodic Groups IVB, VB, VIB, VIIB, and VIII (commonly referred to as transition metals);

e is an integer having a value of 0, 1 or 2;

X is an anion selected from organic sulfonate and halogenated metal or metalloid groups;

f is an integer of 0, 1 or 2, the number of anions required to balance the charge e on the organometallic portion;

with the proviso that the organometallic compound contains at least one metal-carbon bond; and with the proviso that $L^1$, $L^2$, $L^3$, M, e, X, and f are chosen so as to achieve a stable configuration.

3. The composition according to claim 2 wherein ligand $L^1$ is a polymeric compound.

4. The composition according to claim 2 wherein e of Formula I is equal to zero.

5. The composition according to claim 2 wherein e of Formula I is equal to 1.

6. The composition according to claim 2 wherein e of Formula I is equal to 2.

7. The composition according to claim 2 wherein said organometallic compounds are selected from the group consisting of (eta$^5$-methylcyclopentadienyl)manganesetricarbonyl, bis[(eta$^5$-cyclopentadienyl)irondicarbonyl], (eta$^5$-cyclopentadienyl)iron(triphenyltin)dicarbonyl, (eta$^5$-cyclopentadienyl)irondicarbonylchloride, (eta$^5$-cyclopentadienyl)(eta$^6$-mesitylene)iron(+1)trifluoromethylsulfonate(−1), (eta$^5$-cyclopentadienyl)(eta$^6$-mesitylene)iron(+1)hexafluorophosphate(−1).

8. The composition according to claim 1 wherein said cyanate monomer is 2,2-bis(4-cyanatophenyl)propane or oligomers thereof.

9. The composition according to claim 1 wherein said cyanate monomer has the formula:

$$Q(OCN)_p$$

wherein Q comprises at least one 1) a mono-, di-, tri-, or tetravalent aromatic hydrocarbon containing 5 to 30 carbon atoms, 2) 1 to 5 aliphatic or polycyclic aliphatic mono- or divalent hydrocarbons containing 7 to 20 carbon atoms, and 3) a mono- or divalent fluorocarbon group having 3 to 12,500 carbons and 5 to 25,000 fluorine atoms, and p is an integer of 2 to 7.

10. The composition according to claim 9 wherein Q corresponds to a fluorocarbon group of Formula III or IV:

$$F_3C(CFX)_aA(CFX)_bCH_2— \qquad \text{III}$$

wherein A is a carbon-to-carbon bond, in which case a is an integer from 1 to 30 and b is zero, or A is —O—(—CFX—CF$_2$—O—)$_c$, in which case a is an integer 1 to 10, b is one, and c is an integer 1 to 100; and X is fluorine or perfluoroalkyl having 1 to 10 carbon atoms;

$$—CH_2(CFX)_aB(CFX)_bCH_2— \qquad \text{IV}$$

wherein B is 1) a carbon-to-carbon bond, in which case a is an integer of 1 to 30 and b is zero, or 2) B is [(CFX)$_d$O(CFX)$_u$]$_v$, in which case a and b are zero, d and u are integers of 1 to 30, and v is an integer of 1 to 20, or 3) B is (OCF$_2$—CFX)$_w$O(CFX)$_h$O(CFX—CF$_2$O)$_i$, in which case a and b are 1, h is an integer of 1 to 10, and w and i are integers of 1 to 100, or 4) B is [(CF$_2$CH$_2$)$_j$(CF$_2$−$_{CFX}$)$_k$]$_m$, in which case a and b are integers of 1 to 10, j and k are integers whose ratio j/k is 1/1 to 1/10, m is an integer of 1 to 100, and (CF$_2$CH$_2$) and (CF$_2$—CFX) are randomly distributed units; and where X is fluorine or perfluoroalkyl of 1 to 10 carbon atoms.

11. The composition according to claim 9 wherein said aromatic hydrocarbon further comprises 1 to 10 hetero atoms selected from the group consisting of non-peroxidic oxygen, sulfur, non-phosphino phosphorus, non-amino nitrogen, halogen, and silicon.

12. The composition according to claim 9 wherein said aliphatic or polycyclic aliphatic hydrocarbon further comprises 1 to 10 hetero atoms selected from the group consisting of non-peroxidic oxygen, sulfur, non-phosphino phosphorus, non-amino nitrogen, halogen, and silicon.

13. The composition according to claim 1 which has been cured by at least one of thermal energy, electromagnetic radiation, and accelerated particles.

14. The composition according to claim 13 which is a shaped article, coating, film, or photoresist.

15. The composition according to claim 1 which is a film, coating or photoresist.

16. The composition according to claim 1 wherein said curing agent is present in an amount in the range of 0.01 to 20 weight percent of the total composition.

17. A method comprising the steps of:
a) providing a polymerizable mixture according to claim 1, and
b) effecting polymerization of said mixture by at least one of thermal energy, radiation, and accelerated particles.

18. The method according to claim 17 wherein said polymerization is effected by a two-stage process comprising first activating said polymerizable composition by irradiation to provide activated precursors, and then thermally curing the activated precursors, said irradiation temperature being below the temperature used in the thermal curing.

19. The method according to claim 18 wherein the temperature of said irradiation step is in the range of 25° to 300° C.

20. The method according to claim 17 wherein the temperature of said thermal energy is in the range of 80° to 50° C.

21. The method according to claim 17 wherein the temperature of said irradiation is in the range of 25° to 300° C.

22. The method according to claim 17 wherein said polymerizable mixture further comprises an effective amount of a solvent.

23. An article prepared according to the method of claim 17.

24. The method according to claim 17 wherein said composition is a photoresist.

25. An energy polymerizable composition consisting essentially of at least one cyanate monomer or oligomer comprising an organic radical bonded to at least two —OCN groups, at least one cyanate monomer or oligomer comprising an organic radical bonded to one —OCN group, and as curing agent a transition-metal containing organometallic compound in which at least one carbon atom of an organic group is bonded to the metal atom.

* * * * *

UNITED STATES PATENT AND TRADEMARK OFFICE
CERTIFICATE OF CORRECTION

PATENT NO. : 5,215,860

DATED : June 1, 1993

INVENTOR(S) : Fred B. McCormick et al.

It is certified that error appears in the above-identified patent and that said Letters Patent is hereby corrected as shown below:

On the title page, under [56] References Cited, Foreign Patent Documents, add

-- German Patent 1190184  01/65

Col. 1, line 21, "use Cyanate" should read -- use. Cyanate --.

Col. 3, line 51, delete formula I and insert therefor -- $[L^1L^2L^3M]^{+e}X_F$   I --.

Col. 5, line 6, "-C=C-" should be -- -C≡C- --.

Col. 7, line 66, "$W(CO)_5$" should be -- $W(CO)_6$ --.

Col. 7, line 66, "$Fe(CO)_9$" should be -- $Fe(CO)_5$ --.

Col. 7, line 68, "$[CpW(CO)_2]_2$" should be -- $[CpW(CO)_3]_2$ --.

Col. 8, line 19, "$(CO)_5MnpbPh_3$" should read -- $(CO)_5MnPbPh_3$ --.

Col. 8, line 46, "$(CO)_3(Ph_3P)_2Ir(1+)PF_3(1-)$" should be -- $(CO)_3(Ph_3P)_2Ir(1+)PF_6(1-)$ --.

Col. 9, line 60, "1 to 10j" should read -- 1 to 10, j --.

Col. 10, line 3, after "follows" insert -- : --.

UNITED STATES PATENT AND TRADEMARK OFFICE
CERTIFICATE OF CORRECTION

PATENT NO. : 5,215,860
DATED : June 1, 1993
INVENTOR(S) : Fred B. McCormick et al.

It is certified that error appears in the above-indentified patent and that said Letters Patent is hereby corrected as shown below:

Col. 13, line 28, after "runs" insert -- . --.

Col. 14, line 63, delete "pentadienyl" and insert therefor -- cyclopentadienyl or cyclohexadienyl --.

Col. 14, line 67, after "obtained" insert -- . --.

Col. 15, lines 12-13, delete "($eta^5$-pentadienyl)Fe($L^2$)$_3$+" --.

Col. 17, line 41, "$Fe_2(CO)_{69}$" should read -- $Fe_2(CO)_9$ --.

Col. 17, line 43, "$CpFe(CO)_{62}Cl$" should read -- $CpFe(CO)_2Cl$ --.

Col. 21, line 38, "lest" should be -- least --.

Col. 21, line 45, delete formula I and insert therefor -- $[L^1L^2L^3M]^{+e}X_F$      I --.

Col. 21, line 46, after formula I and before "$L^1$" insert -- wherein --.

Col. 22, line 35, after "at least one" insert -- of --.

UNITED STATES PATENT AND TRADEMARK OFFICE
CERTIFICATE OF CORRECTION

PATENT NO. : 5,215,860
DATED : June 1, 1993
INVENTOR(S) : Fred B. McCormick et al.

It is certified that error appears in the above-identified patent and that said Letters Patent is hereby corrected as shown below:

Col. 22, line 63, "$[(CF_2CH_2)j(CF_2\text{-}CFX)K)m,$" should read -- $[(CF_2CH_2)_j(CF_2\text{-}CFX)_k]_m$ --.

Col. 24, line 10, "50°C" should read -- 250°C --.

Signed and Sealed this

Eighth Day of March, 1994

Attest:

BRUCE LEHMAN

Attesting Officer

Commissioner of Patents and Trademarks